United States Patent
Sadowski

(10) Patent No.: US 9,117,511 B2
(45) Date of Patent: Aug. 25, 2015

(54) CONTROL CIRCUITS FOR ASYNCHRONOUS CIRCUITS

(71) Applicant: Advanced Micro Devices, Inc., Sunnyvale, CA (US)

(72) Inventor: Greg Sadowski, Cambridge, MA (US)

(73) Assignee: ADVANCED MICRO DEVICES, INC., Sunnyvale, CA (US)

(*) Notice: Subject to any disclaimer, the term of this patent is extended or adjusted under 35 U.S.C. 154(b) by 0 days.

(21) Appl. No.: 14/195,124

(22) Filed: Mar. 3, 2014

(65) Prior Publication Data

US 2014/0253189 A1 Sep. 11, 2014

Related U.S. Application Data

(60) Provisional application No. 61/775,319, filed on Mar. 8, 2013.

(51) Int. Cl.
*G11C 7/22* (2006.01)
*G06F 1/32* (2006.01)
*G05F 1/46* (2006.01)

(52) U.S. Cl.
CPC .. *G11C 7/22* (2013.01); *G06F 1/32* (2013.01); *G05F 1/465* (2013.01)

(58) Field of Classification Search
None
See application file for complete search history.

(56) References Cited

U.S. PATENT DOCUMENTS

| | | | |
|---|---|---|---|
| 6,457,131 B2 * | 9/2002 | Kuemerle | 713/300 |
| 7,437,582 B1 * | 10/2008 | Parlour | 713/320 |
| 7,921,312 B1 * | 4/2011 | Pennanen et al. | 713/300 |
| 8,166,319 B2 * | 4/2012 | Svensson et al. | 713/320 |
| 8,214,674 B2 * | 7/2012 | Culshaw et al. | 713/323 |
| 8,412,385 B2 * | 4/2013 | Brumett et al. | 700/292 |
| 8,569,911 B2 * | 10/2013 | Burchard et al. | 307/31 |
| 8,578,186 B2 * | 11/2013 | Lee | 713/300 |
| 8,689,037 B2 * | 4/2014 | Rychlik et al. | 713/600 |
| 2010/0122101 A1 * | 5/2010 | Naffziger et al. | 713/340 |
| 2011/0095803 A1 * | 4/2011 | Meijer et al. | 327/291 |
| 2014/0149755 A1 * | 5/2014 | Brock et al. | 713/300 |
| 2014/0247088 A1 * | 9/2014 | Prager et al. | 327/544 |

* cited by examiner

*Primary Examiner* — Thomas J Hiltunen
(74) *Attorney, Agent, or Firm* — Park, Vaughan, Fleming & Dowler LLP

(57) ABSTRACT

The described embodiments include a computing device with one or more asynchronous circuits and control circuits that control the operation of the asynchronous circuits. In some embodiments, the control circuits are arranged in a hierarchy with a top-level control circuit atop the hierarchy and one or more local control circuits lower in the hierarchy. In these embodiments, the top-level control circuit processes operating information for the one or more asynchronous circuits and/or other functional blocks in the computing device to determine an operating state for the computing device. Based on the operating state, the top-level control circuit communicates commands to the local control circuits to cause the local control circuits to operate in corresponding operating modes. Based on a corresponding operating mode command, each local control circuit sets one or more operating parameters for corresponding asynchronous circuits (and/or one or more other functional blocks).

18 Claims, 4 Drawing Sheets

CONTROL CIRCUITS FOR ASYNCHRONOUS CIRCUITS

RELATED APPLICATIONS

The instant application is a non-provisional application from, and hereby claims priority to, U.S. provisional application No. 61/775,319, which was filed on 8 Mar. 2013, and which is incorporated by reference.

GOVERNMENT LICENSE RIGHTS

This invention was made with Government support under prime contract number DE-AC52-07NA27344, subcontract number B600716 awarded by DOE. The Government has certain rights in this invention.

BACKGROUND

1. Field

The described embodiments relate to computing devices. More specifically, the described embodiments relate to control circuits for asynchronous circuits.

2. Related Art

Some computing devices use asynchronous circuits for performing operations (e.g., computational operations, control operations, etc.). Generally, asynchronous circuits are circuits that perform the operations without using a reference signal (e.g., a global clock) to control the functioning of the circuits (in contrast, synchronous circuits use reference signals to control the functioning of the circuits). Although providing some benefits (e.g., reducing power consumption, eliminating some, if not all, clock generation and control circuits and clock signal routing, etc.), using asynchronous circuits means that computing device designers must deal with issues associated with the asynchronous circuits. For example, the performance (in terms of the number of computational operations performed in a given time) and power consumption of some asynchronous circuits fluctuates according to the type and sequence of operations being performed, the data being processed (e.g., the number of bits for a given operation, etc.), and temperature of the circuit itself, and/or based on other factors. This can make the precise identification of the performance and power consumption of computing devices that include asynchronous circuits difficult.

BRIEF DESCRIPTION OF THE FIGURES

Throughout the figures and the description, like reference numerals refer to the same figure elements.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Overview

The described embodiments include a computing device with one or more asynchronous circuits and control circuits that control the operation of the asynchronous circuits. In some embodiments, the control circuits are arranged in a hierarchy with a top-level control circuit atop the hierarchy and one or more local control circuits lower in the hierarchy. In these embodiments, the top-level control circuit processes operating information for the one or more asynchronous circuits and/or other functional blocks in the computing device (e.g., memory circuits, synchronous circuits, etc.) to determine an operating state for the computing device. For example, the top-level control circuit may compare the operating information to one or more thresholds to determine the operating state. Based on the operating state, the top-level control circuit communicates commands to the local control circuits to cause the local control circuits to operate in corresponding operating modes. Based on an operating mode command, each local control circuit sets one or more operating parameters for corresponding asynchronous circuits (and/or one or more other functional blocks). Thus, in some embodiments, the top-level control circuit controls the operation of the local control circuits, and the local control circuits control the operation of corresponding asynchronous circuits (and/or one or more other functional blocks).

By using the control circuits as described, the described embodiments are able to more accurately control the operation (e.g., power consumption, performance, etc.) of the asynchronous circuits. The more accurate control enables more precise identification of the performance and power consumption of the asynchronous circuits, which in turn enables more precise identification of the performance and power consumption of the computing device in which the asynchronous circuits are included.

Computing Device

Figure 1:
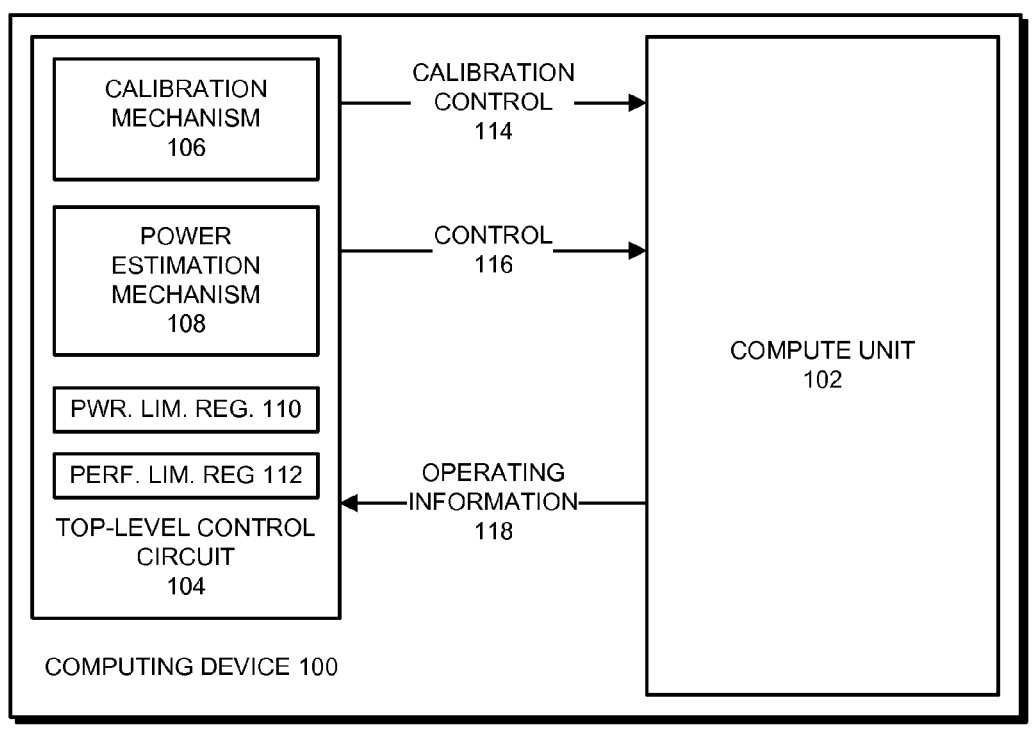
FIG. 1 presents a block diagram illustrating a computing device in accordance with some embodiments.

FIG. 1 presents a block diagram illustrating a computing device 100 in accordance with some embodiments. As can be seen in FIG. 1, computing device 100 includes compute unit 102 and top-level control circuit 104. Compute unit 102 is a functional block that performs computational operations and/or other operations (e.g., control operations, etc.) in computing device 100. In the described embodiments, compute unit 102 includes asynchronous circuits configured to perform at least some of the computational operations and/or other operations. In some embodiments, compute unit 102 also includes other types of circuits, such as synchronous circuits, memory circuits, etc. that may perform some of the computational operations and/or other operations. In some embodiments, compute unit 102 is, or is included in, a central processing unit (CPU), a graphics processing unit (GPU), an embedded processor, an application specific integrated circuit (ASIC), and/or another computational circuit.

Figure 2:
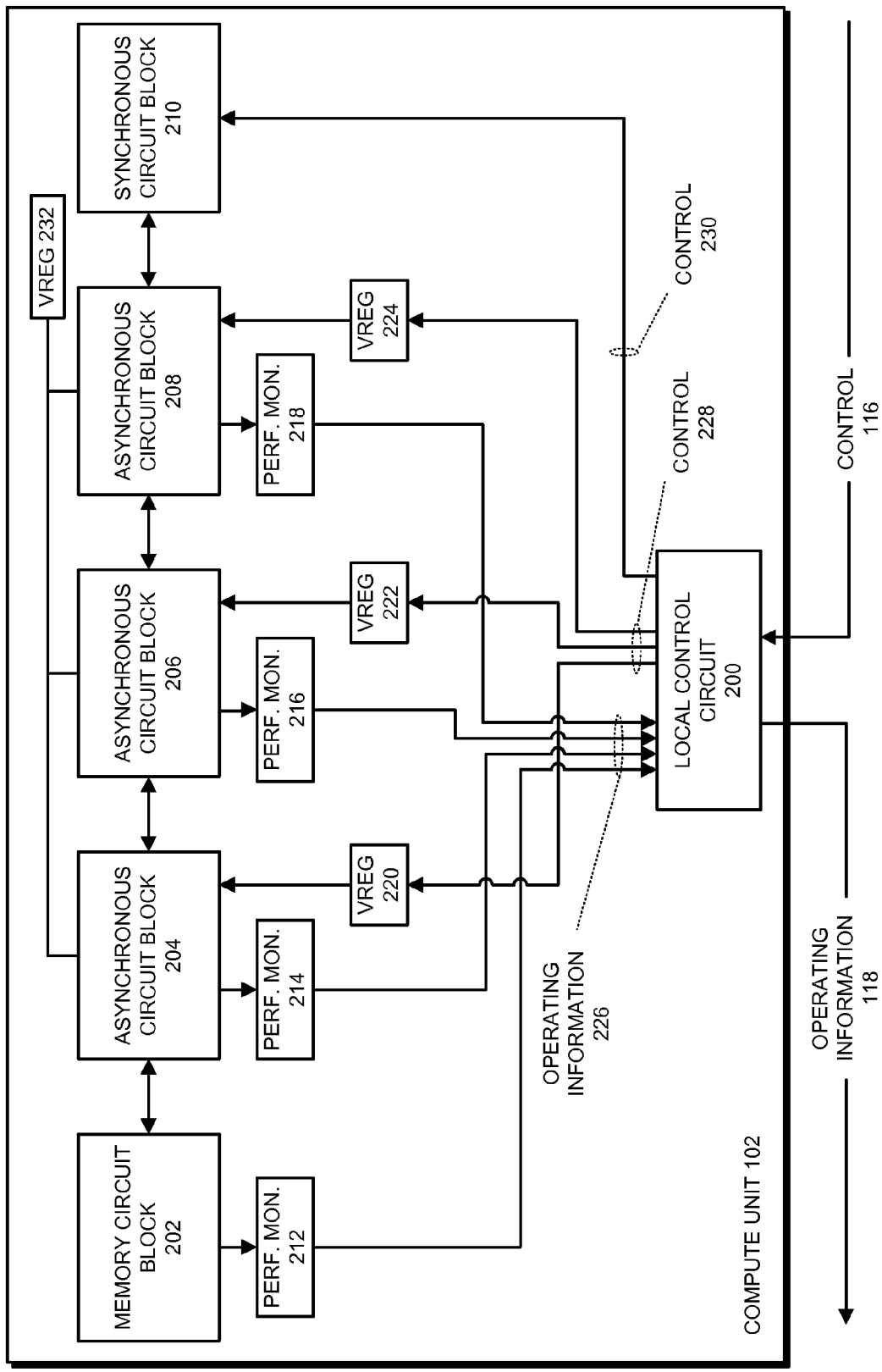
FIG. 2 presents a block diagram illustrating a compute unit in accordance with some embodiments.

FIG. 2 presents a block diagram illustrating compute unit 102 in accordance with some embodiments. As can be seen in FIG. 2, compute unit 102 includes local control circuit 200, memory circuit block 202, asynchronous circuit blocks 204-208, synchronous circuit block 210, performance monitors 212-218 (shown as "PERF. MON. 212," etc.), and voltage regulators 220-224 and 232 (shown as "VREG 220," etc.). Local control circuit 200 is a functional block that performs operations for controlling the operation of asynchronous circuit blocks 204-208 and synchronous circuit block 210. For example, local control circuit 200 may control (set, adjust, etc.) operational parameters (e.g., voltage, current, temperature, operation performance rate, power consumption, memory access rate, etc.) for asynchronous circuit blocks 204-208 and/or synchronous circuit block 210 based on a command received from top-level control circuit 104 to enter a particular operating mode (e.g., higher-performance, lower-performance, higher-power, lower-power, etc.). Local control circuit 200 may also acquire operating information from one or more of memory circuit block 202, asynchronous circuit blocks 204-208, and synchronous circuit block 210 and provide the operating information or information based on the operating information to top-level control circuit 104 to be used as described herein. Local control circuit 200 may further acquire operating information from one or more of memory circuit block 202, asynchronous circuit blocks 204-208, and synchronous circuit block 210 and use the operating information or information based on the operating information to determine how operational parameters are to be set in accordance with the operating mode.

Memory circuit block 202 includes memory circuits and/or caches along with control circuits for accessing data stored in the memory circuits and/or caches. In some embodiments, memory circuit block 202 stores data (where the term "data" encompasses one or more of instructions, computational data, etc.) for asynchronous circuit blocks 204-208 and synchronous circuit block 210 that can be accessed (read, written, deleted, invalidated, etc.) when performing operations. In some embodiments, memory circuit block 202 is or is part of a memory system in compute unit 102 (and, more generally, in computing device 100).

Asynchronous circuit blocks 204-208 are functional blocks that include circuits that are configured to perform operations at least in part without requiring reference signals such as global clocks, etc. Generally, in the described embodiments, the operations performed by asynchronous circuit blocks 204-208 can include any computational and/or control operations that can be performed by asynchronous circuits. For example, asynchronous circuit blocks 204-208 may perform logical operations, mathematical operations (vector operations, matrix operations), graphics processing operations, network traffic processing, memory accesses, etc.

In some embodiments, one or more of asynchronous circuit blocks 204-208 include general-purpose processing circuits that can be configured (e.g., via instructions, commands, etc.) to perform corresponding operations. In some of these embodiments, the general-purpose processing circuits include pipelines and/or circuits with "stages," each of which performs a corresponding portion of operations. In some embodiments, two or more of the asynchronous circuit blocks themselves each include one or more stages for an overall processing circuit (e.g., pipeline) that includes two or more of asynchronous circuit blocks 204-208. In some embodiments, one or more of asynchronous circuit blocks 204-208 include purpose-specific processing circuits that are configured to perform particular operations, with or without instructions, commands, etc.).

In some embodiments, each of asynchronous circuit blocks 204-208 can perform different types of operations and/or different portions of shared operations. In these embodiments, two or more of asynchronous circuit blocks 204-208 may perform portions of a shared operation in parallel or serially. For example, in some embodiments, the asynchronous circuit blocks may be stages in a serial processing circuit (e.g., a pipeline). In these embodiments, asynchronous circuit block 204 performs a first portion of an operation and forwards an output from the first portion to asynchronous circuit block 206. Asynchronous circuit block 206 then, based at least in part on the output received from asynchronous circuit block 204, performs a second portion of the operation and forwards an output from the second portion to asynchronous circuit block 208 to be operated on therein.

In some embodiments, due to the interoperation of the asynchronous circuit blocks (e.g., the processing of different portions of a shared operation, the dependence on the output of a given asynchronous circuit block by another asynchronous circuit block, etc.), operating information from a given asynchronous circuit block may be used to determine how one or more operating parameters of one or more other asynchronous circuit blocks are set. For example, a current operational load in asynchronous circuit block 204 may be used to determine a future related operational load in asynchronous circuit blocks 206 and/or 208 and thus how an operating parameter should be set in asynchronous circuit blocks 206 and/or 208 (the setting of operational parameters is described in more detail below). By using operational loads in prior circuits as described, these embodiments can increase the performance of an asynchronous circuit in anticipation of the increase in the operational load (i.e., based on an operational load of an earlier asynchronous circuit), instead of responding to a load (and thus a bottleneck in operational flow) after the fact.

Synchronous circuit block 210 is a functional block that includes circuits that are configured to perform operations at least in part based on a reference signal such as a global clock, etc. In the described embodiments, the operations performed by synchronous circuit block 210 can include any computational and/or control operations that can be performed by a synchronous circuit. For example, synchronous circuit block 210 may perform logical operations, mathematical operations (vector operations, matrix operations), graphics processing operations, network traffic processing, memory accesses, control operations, etc.

In some embodiments, synchronous circuit block 210 receives outputs from at least one asynchronous circuit block (as illustrated using asynchronous circuit block 208 in FIG. 2) and performs operations based on the received outputs. Thus, in these embodiments, the corresponding operations in synchronous circuit block 210 depend on the output of the at least one asynchronous circuit block. In these embodiments, due to the interoperation of synchronous circuit block 210 with the at least one asynchronous circuit block, operating information from the at least one asynchronous circuit block may be used to determine how local control circuit 200 should set one or more operating parameters of synchronous circuit block 210 (as described in more detail below).

Performance monitors 212-218 are functional blocks that include circuits that are used to monitor the performance of corresponding circuit blocks and provide operating information and/or information that is used to generate operating information for the corresponding circuit block to local control circuit 200. When monitoring the performance of the corresponding asynchronous circuit block, performance monitors 212-218 receive and/or determine the operating information and/or the information that is used to generate the operating information for the corresponding circuit block. For example, in some embodiments, performance monitor 212 includes circuits for monitoring or otherwise determining the performance of memory operations, such as cache hits/misses, the rate/rate trend for memory accesses, the time or average time for performing memory accesses, the instructions accessed, and/or other performance metrics. As another example, in some embodiments, performance monitors 214-218 include circuits for monitoring or otherwise determining the performance of operations in the corresponding asynchronous circuit block, such as the rate/rate trend of operation performance, the fullness/emptiness of operational queues, the delays in performing operations due to dependencies on the output of other asynchronous circuit blocks, the time or average time taken to perform particular operations, the average time per operation, the idle/active time for the corresponding asynchronous circuit block, the percentage of asynchronous circuit block that is idle/busy, and/or other performance metrics.

In some embodiments, the operating information and/or information that is used to generate the operating information for the corresponding circuit comprises one or more values (e.g., numeric values, bit patterns, etc.) that represent corresponding operating information and/or from which the operating information can be generated. In some embodiments, the values (or one or more intermediate values from which the values can be computed) are determined on-demand (e.g., periodically, based on a request from local control circuit 200, based on one or more signals from the corresponding asynchronous circuit block, etc.). In other embodiments, the values (or one or more intermediate values from which the values can be computed) are stored and can be accessed as needed by the corresponding performance monitor.

Voltage regulators 220-224 and 232 include voltage regulator circuits that are configured to set at least one supply voltage for circuits in corresponding asynchronous circuit block(s). For example, voltage regulator 220 sets one or more supply voltages for circuits in asynchronous circuit block 204. As another example, voltage regulator 232 sets one or more supply voltages for circuits in asynchronous circuit blocks 204-208. In some embodiments, supply voltage (or simply "voltage") is an operating parameter that can be set by local control circuit 200 in response to control 116 from top-level control circuit 104. In these embodiments, voltage regulators 220-224, upon receiving a corresponding command/signal from local control circuit 200, set at least one supply voltage for circuits in the corresponding asynchronous circuit block to a corresponding level. However, in some embodiments, not all of the circuits in the asynchronous circuit blocks can be set to the corresponding level. For example, some circuits (e.g., memory circuits, computational circuits, etc.) may not operate properly if their supply voltage is not maintained at a given level. Thus, in some embodiments, voltage regulator 232 is configured to supply a voltage (e.g., a fixed/constant voltage, a voltage higher than a threshold voltage, etc.) to portions of the circuits in asynchronous circuit blocks 204-208.

In some embodiments, communication paths (that include one or more buses, wires, and/or connections) are coupled between the various elements in compute unit 102, as shown by arrow-headed lines between the elements. As can be seen in FIG. 2, in some embodiments, the communication paths include an operating information 226 communication path from each of performance monitors 212-218, a control 228 communication path to each of voltage regulators 220-224, and a control 230 communication path to synchronous circuit block 210. Each operating information 226 communication path is used for communicating operating information and/or information that is used to generate operating information from the corresponding performance monitor to local control circuit 200. Each control 228 communication path is used for communicating commands (e.g., control signals) to a corresponding voltage regulator for setting at least one supply voltage for circuits in the corresponding asynchronous circuit block. The control 230 communication path is used for communicating commands to synchronous circuit block 210 from local control circuit 200, the commands for controlling one or more operations performed in synchronous circuit block 210.

Although FIG. 2 is presented with a particular arrangement of functional blocks and elements, in some embodiments, different functional blocks and/or elements may be present in compute unit 102. For example, a different number or arrangement of circuit blocks may be present in some embodiments. In addition, in some embodiments, local control circuit 200 sets an operating parameter other than or in addition to voltage, and thus different elements relating to the setting of the operational parameter (temperature controllers/monitors, instruction counters, power controllers/monitors, issue queues, etc.) may be present in compute unit 102. In addition, in some embodiments, compute unit 102 has two or more local control circuits 200, each of which interacts with one or more separate circuit blocks in compute unit 102. Generally, the described embodiments include sufficient functional blocks to perform the operations herein described.

Also, although communication paths are shown between various functional blocks and elements in FIG. 2, in some embodiments, the communication paths are configured differently. For example, in some embodiments, operating information can be acquired directly from circuit blocks (i.e., the corresponding performance monitor may not be present), and thus the corresponding communication path may be routed directly to the circuit block. As another example, in some embodiments, an operational parameter other than, or in addition to, voltage is set for one or more of the asynchronous circuit blocks. Thus, a control 228 communication path may be routed between local control circuit 200 and the corresponding asynchronous circuit block (or elsewhere). As yet another example, although communication paths are shown between certain functional blocks, in some embodiments, communication paths may be located between more or less functional blocks (between memory circuit block 202 and one or more of asynchronous circuit blocks 206-208 and/or synchronous circuit block 210, etc.). As still another example, paths shown in FIG. 2 as bi-directional (via double-headed arrows) may be uni-directional. Generally, the described embodiments include sufficient communication paths to perform the operations herein described.

Returning to FIG. 1, top-level control circuit 104 is a functional block that performs operations related to controlling the operation of circuit blocks in compute unit 102 (e.g., asynchronous circuit blocks 204-208, synchronous circuit block 210, etc.). For example, based on operating information for asynchronous circuit blocks 204-208 and/or one or more other functional blocks in compute unit 102, top-level control circuit 104 can control (set, adjust, etc.) operating modes for local control circuit 200 to control the amount of power consumed in computing device 100 and/or the overall performance (computational operations performed per unit time, etc.) of computing device 100. The control of the operating modes is described in more detail below.

As shown in FIG. 1, in some embodiments, top-level control circuit 104 includes calibration mechanism 106, power estimation mechanism 108, power limit register 110 (shown as "PWR. LIM. REG. 110"), and performance limit register 112 (shown as "PERF. LIM. REG. 112"). In some embodiments, calibration mechanism 106 performs operations for calibrating top-level control circuit 104 to enable top-level control circuit 104 to control operating modes for local control circuit 200.

In some embodiments, during a calibration operation, calibration mechanism 106 causes one or more circuit blocks in compute unit 102 to perform one or more operations (e.g., executing an instruction, processing a given load (where a "load" includes a corresponding set of sub-operations), performing a particular function/routine, and/or otherwise performing a computational, control, etc. operation) while operational parameters are at known levels (e.g., set to the known levels, maintained at known levels, measured to be at known levels, etc.). For example, calibration mechanism 106 may cause asynchronous circuit blocks 204-206 to perform one or more operations while the temperature and/or voltage of the asynchronous circuit blocks 204-206 are at known values. While the one or more operations are performed, calibration mechanism 106 monitors operating information relating to the performance of the one or more operations. For example, calibration mechanism 106 may monitor operating information such time taken to perform each of the operations, rate of operation performance, power consumed by the one or more circuit blocks, temperature change of the circuit blocks, etc. Based on the operating information, calibration mechanism 106 determines an operating estimate for each of the one or more operations. Generally, each operating estimate is an estimate of the one or more asynchronous circuit blocks' performance when performing a corresponding operation. The operating estimate includes one or more values for the operation that can subsequently be used to determine a "cost" of performing the operation in terms of one or more operating parameters (e.g., time, power, temperature, operation rate, etc.). For example, in some embodiments, an operating estimate is an estimate of the power that is used by the one or more asynchronous circuit blocks when performing a corresponding operation. As another example, in some embodiments, an operating estimate is an estimate of a time taken for performing a corresponding operation by the one or more asynchronous circuit blocks and/or the rate at which the operation can be performed.

In some embodiments, when an operation is performed by two or more separate circuit blocks within compute unit 102 (e.g., two or more asynchronous circuit blocks), the operating estimate may account for the two or more circuit blocks. For example, the asynchronous circuit blocks may include an asynchronous multiplier and an asynchronous logic circuit and the operation may include a multiplication of input operands followed by a logical operation that uses the product of the multiplication as an input (i.e., an output of the multiplier circuit feeds into an input of the logic circuit). In this case, calibration mechanism 106 may monitor the performance of the operation by monitoring the performance of the component sub-operations, and may determine an operating estimate that accounts for each circuit block's contribution to the operation. In some embodiments, the operating estimate includes a weight for each of the two or more separate circuit blocks, the weight indicating a contribution of each of the circuit blocks to the operating estimate. In some embodiments, the weight is used to determine the "cost" of performing the operation on a per-circuit-block basis.

As described above, in some embodiments, when performing the calibration operation, calibration mechanism 106 monitors the power consumed by one or more circuit blocks when performing operations. In some embodiments, power estimation mechanism 108 includes circuits configured to estimate or otherwise determine the power consumed in the one or more circuit blocks as the operations are performed. The estimated/determined power can then be returned to calibration mechanism 106 to be used as described above. In some embodiments, to enable the estimation, the asynchronous circuit blocks that are performing the operations (or other functional blocks) return power measurements to power estimation mechanism 108 and power estimation mechanism 108 computes a power consumption for the operation. In some embodiments, power estimation mechanism 108 acquires information (currents, voltages, etc.) that can be used to compute the power consumed by the asynchronous circuit blocks when performing an operation from one or more functional blocks in computing device 100 and uses the acquired power information to determine the power consumption of the asynchronous circuit blocks.

In some embodiments, top-level control circuit 104 determines an operating mode for local control circuit 200 based on acquired operating information. In these embodiments, top-level control circuit 104 may compare operating information to one or more thresholds to determine the operating mode. For example, in some embodiments, top-level control circuit 104 controls the performance of computing device 100 by maximizing the number of instructions executed in a given time, while maintaining temperatures of the asynchronous circuits below corresponding temperature thresholds. In these embodiments, top-level control circuit 104 may acquire operating information relating to the number of instructions fetched (from memory circuit block 202) or executed (from an asynchronous circuit block) and the temperature of one or more asynchronous circuit blocks. Top-level control circuit 104 may then compare one or both of the number of instructions fetched or executed and the temperature of the one or more asynchronous circuits to corresponding thresholds (e.g., may compare the temperature of the one or more asynchronous circuits to a maximum temperature threshold to ensure that the asynchronous circuits are not above the temperature threshold). Based on the comparison(s), top-level control circuit 104 may send one or more commands on control 116 to indicate an operating mode of local control circuit 200.

In some embodiments, a threshold value is stored in each of power limit register 110 and performance limit register 112. In these embodiments, the value stored in power limit register 110 is a value that represents a threshold for power consumption. For example, power limit register 110 may be an 8-bit register for which 0-8 bits can be set relative to a power consumption level (e.g., 0 bits set for no power consumption, 8 bits set for a maximum amount of power consumption, and intermediate numbers of bits set for intermediate values of power consumption). In addition, in these embodiments, the value stored in performance limit register 110 is a value that represents a threshold for performance. As described above, in these embodiments, top-level control circuit 104 may retrieve the value for the threshold from the corresponding register and compare operating information to the threshold to determine an operating mode local control circuit 200. Note, however, that, in some embodiments, threshold values are acquired from somewhere other than the registers (e.g., memory circuit block 202, etc.)

In some embodiments, communication paths (that include one or more buses, wires, and/or connections) are coupled between the various elements in computing device 100 (compute unit 102 and top-level control circuit 104), as shown by arrow-headed lines between the elements. As can be seen in FIG. 1, in some embodiments, the communication paths include calibration control 114, control 116, and operating information 118. Calibration control 114 is used to communicate calibration commands such as operational parameter settings and operation-related commands from top-level control circuit 104/calibration mechanism 106 to compute unit 102. Control 116 is used to communicate control signals to local control circuit 200, the control signals configured to cause local control circuit 200 transition to (or remain in) corresponding operating modes. Operating information 118 is used to communicate operating information for circuit blocks in compute unit 102 from local control circuit 200 to top-level control circuit 104 to be used in determining the operating mode for local control circuit 200 (and thus for determining corresponding adjustments to one or more operational parameters for one or more of asynchronous circuits 204-208).

Although embodiments are described with one compute unit 102, some embodiments include a different number and/or arrangement of compute units 102. For example, some embodiments two, five, eight, or another number of compute units 102. Generally, the described embodiments can use any arrangement of compute units 102 that can perform the operations herein described. In these embodiments, each of the multiple compute units 102 may be internally arranged similarly to the arrangement shown in FIG. 2, or may have a different number or arrangement of functional blocks, circuit blocks, and/or elements. In some embodiments, each compute unit 102 includes a local control circuit similar to local control circuit 200 that functions in a similar way to local control circuit 200 with regard to setting operating parameters for circuit blocks in the compute unit 102 based on control signals from top-level control circuit 104. In these embodiments, top-level control circuit 104 may use operating information from one or more of the compute units 102 when determining an operating mode for a given local control circuit 200. For example, a temperature from one or more neighboring compute units 102 may be used in determining the operating mode for the local control circuit 200 in a given compute unit 102 to prevent the given compute unit 102 overheating the neighboring compute units 102. Thus, top-level control circuit 104 may interact with each of the local control circuits in a similar way to the way top-level control circuit 104 is described herein as interacting with local control circuit 200, but may also consider operating information from some or all of the local control circuits (e.g., as a group) when setting operating modes for one or more of the local control circuits.

Moreover, although computing device 100 is simplified for illustrative purposes, in some embodiments, computing device 100 includes additional mechanisms for performing the operations herein described and other operations. For example, computing device 100 may include power controllers, batteries, media processors, input-output mechanisms, communication mechanisms, networking mechanisms, display mechanisms, etc.

Computing device 100 can be, or can be included in, any electronic device that performs computational operations. For example, computing device 100 can be or can be included in electronic devices such as desktop computers, laptop computers, wearable computing devices, tablet computers, smart phones, servers, network appliances, toys, audio-visual equipment, home appliances, controllers, etc., and/or combinations thereof.

Performing a Calibration Operation

Figure 3:
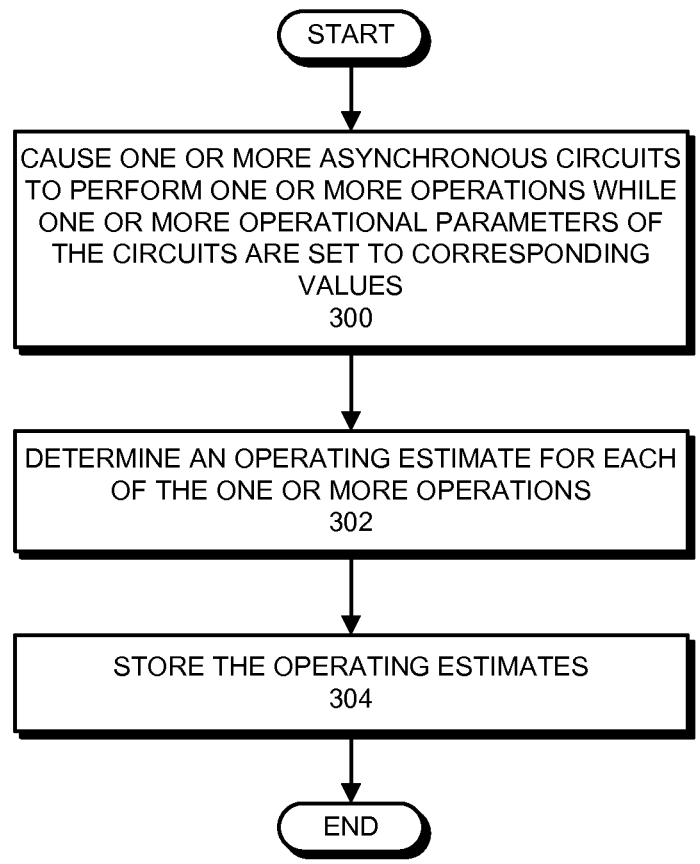
FIG. 3 presents a flowchart illustrating a process for performing a calibration operation in accordance with some embodiments.

FIG. 3 presents a flowchart illustrating a process for performing a calibration operation in accordance with some embodiments. Note that the operations shown in FIG. 3 are presented as a general example of operations performed by some embodiments. The operations performed by other embodiments include different operations and/or operations that are performed in a different order. Additionally, although certain mechanisms are used in describing the operations (e.g., calibration mechanism 106, compute unit 102, etc.), in some embodiments, other mechanisms may perform the operations.

The process shown in FIG. 3 starts when calibration mechanism 106 causes one or more of asynchronous circuit blocks 204-208 in compute unit 102 to perform one or more operations while one or more operational parameters of the one or more asynchronous circuit blocks are set to corresponding values (step 300). For example, for each of the operations, calibration mechanism 106 causes the one or more asynchronous circuit blocks to execute an instruction, process a given load, perform a particular function/routine, and/or otherwise perform a computational, control, etc. operation. Note that, as part of this operation, one or more other circuit blocks in compute unit 102 may also perform portions of the operations.

By causing "one or more" asynchronous circuit blocks to perform the one or more operations, in some embodiments, calibration mechanism 106 causes compute unit 102 to perform operations for which two or more asynchronous circuit blocks (e.g., asynchronous circuit block 204, asynchronous circuit block 206, etc.) each perform a portion of the operations. The operations may be performed by the one or more asynchronous circuit blocks in parallel and/or serially. For example, performing the above-described function may include asynchronous circuit block 204 performing one or more operations to generate output that is then used (as an input) by asynchronous circuit block 206 for performing one or more operations, and thus the operations are performed serially by the asynchronous circuit blocks. As another example, performing the above-described function may include asynchronous circuit block 204 and asynchronous circuit block 206 performing one or more operations to process different portions of a load in parallel (e.g., performing mathematical operations for different sets of elements of a matrix during a matrix-processing operation).

In some embodiments, in order to set the one or more operational parameters of the one or more asynchronous circuit blocks to corresponding values, calibration mechanism 106 sets (or causes other functional blocks to set) or otherwise maintains the operating parameters at predetermined values while the asynchronous circuit blocks perform each of the one or more operations. For example, calibration mechanism 106 may set one or more supply voltages for one or more of the asynchronous circuit blocks to specified values before causing the asynchronous circuit block to perform each operation. As another example, calibration mechanism 106 may set one or more temperatures for one or more of the asynchronous circuit blocks to specified values for each operation (e.g., a heat source or cooling device may be used to maintain the temperature for one or more portions of the one or more of the asynchronous circuit blocks within a given range of a specified temperature). As another example, calibration mechanism 106 may "set" a temperature to a specified value for each operation for a corresponding asynchronous circuit block by monitoring the temperature during the operation to ensure that the temperature remains within a given range of a specified temperature during the operation.

Next, calibration mechanism 106 determines an operating estimate for each of the one or more operations (step 302). During this operation, calibration mechanism 106 monitors operating information relating to the performance of the one or more operations and uses the monitored operating information to determine the operating estimates. For example, if the operating estimate is for the power consumed by the one or more asynchronous circuit blocks while performing a corresponding operation, calibration mechanism 106/power estimation mechanism 108 may monitor the power consumed by the asynchronous circuit blocks during each operation (the power consumed is the operating information) and then use the consumed power to generate the operating estimate for the operation. As another example, if the operating estimate is for the time taken to perform the operation (e.g., the number of microseconds to perform the operation, the rate of operational performance, etc.), calibration mechanism 106 can monitor the time taken by the asynchronous circuit blocks for performing the corresponding operation (the time is the operating information) and then use the time to generate the operating estimate for the operation. Generally, the operating estimate can be made for any operating information or combination thereof that can be acquired from the one or more asynchronous circuit blocks (current, voltage, temperature, movement, sound, illumination, power, time, etc.) and/or derived or computed from the operating information (cycles per second, average values, power, temperature trend, etc.).

For the operation in step 302, "determining" may include one or more of measuring, receiving, computing/generating, and/or otherwise acquiring operating information for each operation. For example, assuming that the operating estimates are for the power that is consumed during each operation, in some embodiments, power estimation mechanism 108 uses one or more dedicated monitoring mechanisms (transducers, circuits, etc.) to measure the consumed power or to measure operating information such as current or voltage that can be used to compute power consumption for the one or more asynchronous circuit blocks. As another example, in some embodiments, power estimation mechanism 108 receives power consumption information or operating information (current, voltage, etc.) that can be used to compute power consumption from the one or more asynchronous circuit blocks as the operations are performed.

Calibration mechanism 106 then stores the operating estimates (step 304). During this operation, calibration mechanism 106 stores the operating estimates (or representations thereof) in a data structure, memory circuit, table, etc., from which the operating estimates can be retrieved to enable the subsequent acquisition of the operating information for the operations (as described herein).

In some embodiments, an initial calibration operation is performed during a development or manufacturing operation. In these embodiments, the initial calibration operation may be performed under controlled conditions in a lab or in a factory with operating parameters for computing device 100 set to known values (e.g., with set environmental temperatures, set voltages, etc.) to arrive at an initial set of operating estimates. The initial set of operating estimates may include operating estimates for each of a specified set of operations at designated combinations of the operating parameters (e.g., at each of a set of temperature/voltage combinations). In some embodiments, one or more subsequent calibration operations may be performed to adjust the initial set of operating estimates. For example, in some embodiments, a calibration operation is performed every N operating hours. In some embodiments, the subsequent calibration operations may include less operations and/or less operating parameter values, and thus may generate a sample of operating estimates that are used as a guideline for adjusting other operating estimates in the initial set of operating estimates.

Note, however, that some embodiments perform calibration operations only after computing device has passed development and manufacturing phases (i.e., "in the field," such as after an initial power-up by a purchaser of computing device 100). For example, as a system in which computing device 100 is included is first configured or installed. In these embodiments, the above-described "initial set of operating estimates" are generated in the field and may or may not be wholly or partially updated by subsequent calibration operations. In some of these embodiments, at least some of the calibration operations are performed for a subset of a set of available operations and/or a subset of the operating parameters. In these embodiments, intermediate operating estimates (operating estimates for operations that were not performed and/or for which certain operating parameter settings were not checked) can be interpolated from the generated operating estimates.

In some embodiments, the calibration operation is performed in response to a request from application software, an operating system, a control mechanism, etc. In other embodiments, one or more mechanisms in top-level control circuit 104 may trigger or cause the calibration operation (timers, controllers, etc.).

Adjusting Operational Parameters for Asynchronous Circuit Blocks

Figure 4:
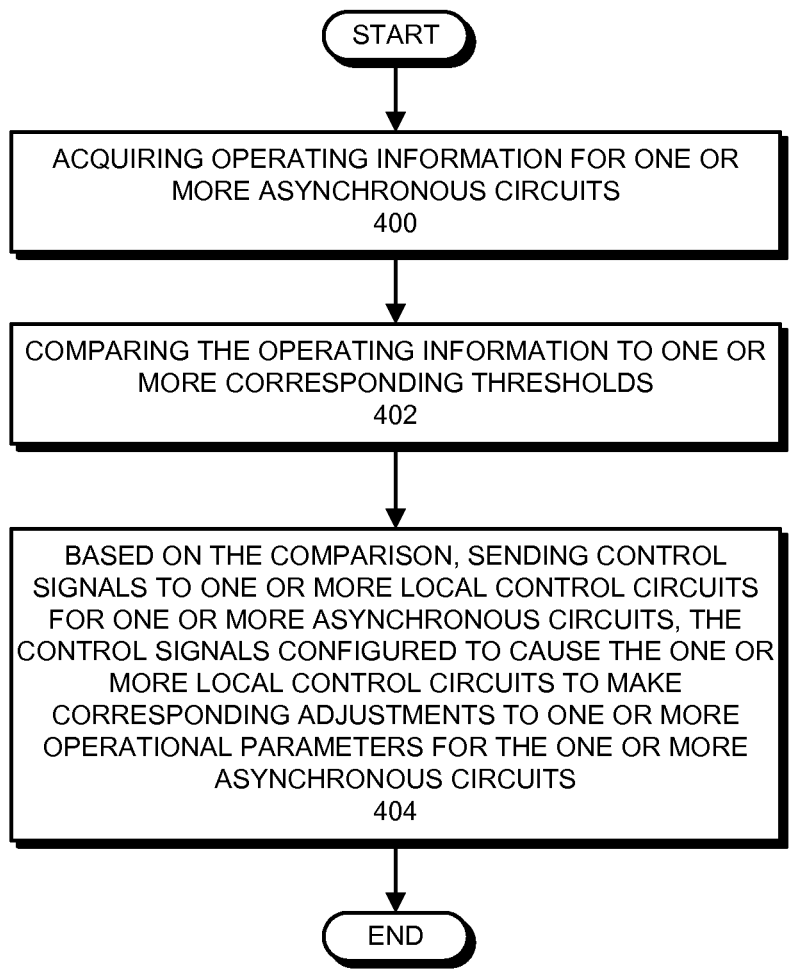
FIG. 4 presents a flowchart illustrating a process for adjusting operational parameters for one or more asynchronous circuit blocks in accordance with some embodiments.

FIG. 4 presents a flowchart illustrating a process for adjusting operational parameters for one or more asynchronous circuit blocks in accordance with some embodiments. Note that the operations shown in FIG. 4 are presented as a general example of operations performed by some embodiments. The operations performed by other embodiments include different operations and/or operations that are performed in a different order. Additionally, although certain mechanisms are used in describing the operations (e.g., top-level control circuit 104, local control circuit 200, asynchronous circuit blocks 202-204, etc.), in some embodiments, other mechanisms may perform the operations.

The process shown in FIG. 4 starts when top-level control circuit 104 acquires operating information for one or more asynchronous circuit blocks (step 400). For example, top-level control circuit 104 send a signal to local control circuit 200, compute unit 102, and/or another functional block that causes reporting of the operating information (e.g., causes local control circuit 200, compute unit 102, and/or another functional block to send message(s) to top-level control circuit 104 that include the operating information). As another example, top-level control circuit 104 may read one or more registers, memory locations, etc. that contain operating information that is updated during operation of the asynchronous circuit blocks.

In some embodiments, "operating information" includes information that can be acquired from the asynchronous circuit blocks, information about the asynchronous circuit blocks that is acquired from another source, and/or information generated, computed, or determined from such information. For example, operating information may include power consumption information acquired from the asynchronous circuit blocks, local control circuit 200, and/or computing device 100. As another example, operating information such as power consumption may be computed based on current, voltage, etc. information acquired from the asynchronous circuit blocks, local control circuit 200, and/or computing device 100.

In some embodiments, the operating information includes values computed using the above-described operating estimates. In these embodiments, the one or more asynchronous circuit blocks, local control circuit 200, and/or another functional block may indicate, to top-level control circuit 104, operations that are being and/or are to be performed by the one or more asynchronous circuit blocks. For example, the one or more asynchronous circuit blocks, memory circuit block 202, local control circuit 200, and/or another functional block may indicate one or more of: instructions being or to be executed; loads being or to be processed; functions/routines being or to be performed; and/or other computational, control, etc. operations being or to be performed by the one or more asynchronous circuit blocks. Top-level control circuit 104 then uses the indicated operations and the stored operating estimates to compute, generate, and/or determine the operating information. For example, assuming that the operating estimates include a time taken for performing various operations at corresponding temperatures, top-level control circuit 104 may compute the operating information by using the indicated operations and information about current or projected future temperatures for the one or more asynchronous circuit blocks to retrieve corresponding operating estimates (from a location in memory, from a table or list, etc.) and sum or otherwise combine the operating estimates to arrive at an estimated total time for performing the operations (which is the operating information).

In some embodiments, as described above, the operating information includes future operating information for a given circuit block. For example, the operating information may include projections of future temperatures, power consumption, etc. based on trends in current and past temperatures, power consumption, etc. As another example, as described above, the operating information may include (or may be based on) information about operations to be performed, which may be acquired from program code, known operational sequences, operating states of the asynchronous circuit blocks, etc.

In some embodiments, top-level control circuit 104 also acquires operating information (possibly via local control circuit 200) from one or more of memory circuit block 202 and synchronous circuit block 210. For example, top-level control circuit 104 can acquire information about operations to be performed by the one or more asynchronous circuit blocks from memory circuit block 202 and/or synchronous circuit block 210. In some embodiments, this information includes information about operations being performed in memory circuit block 202 and synchronous circuit block 210 (fetches of instructions from memory, execution of related functions or instructions, etc.) that serve as indications of operations to be performed and/or computing loads in the one or more asynchronous circuit blocks.

Top-level control circuit 104 then compares the operating information to one or more thresholds (step 402). During this operation, top-level control circuit 104 retrieves thresholds stored in top-level control circuit 104, generated by an operating system or application executing on computing device 100, provided remotely (e.g., provided by a system developer/administrator, provided by a monitoring device, etc.), and/or otherwise made available to top-level control circuit 104. For example, in some embodiments, top-level control circuit 104 retrieves the thresholds from one or more of power limit register 110 and performance limit register 112. Generally, the thresholds are limits represented by one or more values (e.g., discrete values, ranges of values, etc.) to which operating information is to be compared to determine an operating mode into which local control circuit 200 is to be placed (and thus which corresponding adjustments are to be made to operational parameters of the one or more asynchronous circuit blocks). For example, assuming that the operating information indicates one or more temperatures of the one or more asynchronous circuit blocks, the thresholds may be for temperatures (e.g., one or more of a safe temperature, a warning temperature, and an unsafe temperature), and each of the thresholds may be associated with an operating mode into which local control circuit 200 or, more generally, compute unit 102, is to transition. In these embodiments, each operating mode is generally associated with one or more settings for operational parameters for corresponding asynchronous circuit blocks. Continuing with the example, a temperature higher than the warning temperature may cause local control circuit 200 to reduce a voltage (i.e., the operating parameter) supplied to one or more portions of the asynchronous circuit blocks.

Based on the comparison, top-level control circuit 104 sends control signals to local control circuit 200, the control signals configured to cause local control circuit 200 to make adjustments to one or more operational parameters for the one or more asynchronous circuit blocks (step 404). For example, in some embodiments, top-level control circuit 104 sends one or more control signals to local control circuit 200 by sending one or more signals (comprising logical zeros, logical ones, etc.) on wires in the control 116 communication path that are coupled to inputs of local control circuit 200. As another example, top-level control circuit 104 may send a message in a corresponding format (i.e., with particular header data, payload data, and/or other data) on a bus coupled between top-level control circuit 104 and local control circuit 200. As yet another example, top-level control circuit 104 may write predetermined data into a shared memory location (register, memory circuit, etc.), the predetermined data configured to cause local control circuit 200 to operate in a particular operating mode.

As described above, in some embodiments, when causing local control circuit 200 to make adjustments to one or more operational parameters for the one or more asynchronous circuit blocks, top-level control circuit 104 causes local control circuit 200 to operate in a particular operating mode. When in the operating mode, local control circuit 200 makes corresponding adjustments to one or more operational parameters for the one or more asynchronous circuit blocks. For example, top-level control circuit 104 can determine, based on a comparison of the temperature (i.e., operating information) of one or more asynchronous circuit blocks to corresponding temperature thresholds, that one or more asynchronous circuit blocks are in danger of overheating. Based on this determination, top-level control circuit 104 can communicate a control signal to local control circuit 200 to place local control circuit 200 in a lower-performance or lower-power operating mode. When in the lower-performance operating mode, local control circuit 200 sets one or more operating parameters for the asynchronous circuit blocks to cause the asynchronous circuit blocks to operate with lower voltage, perform less operations per unit of time, etc. so that the asynchronous circuit blocks (and/or other circuit blocks) can cool down. As described below, some embodiments can support any number of operating modes, each of which is associated with adjustments for one or more operating parameters.

In some embodiments, as an example of the operations for FIG. 4, top-level control circuit 104 detects, via operating information about operation performance rates (e.g., instruction execution rates, instruction fetch rates, etc.) in one or more circuit blocks in compute unit 102 and in comparison to a threshold such as a performance limit from performance limit register 112, cases of "input starvation" of asynchronous circuit blocks (and/or other circuit blocks). Input starvation occurs when an earlier circuit block is not providing an adequate amount of instructions, inputs, data, etc. to keep a later circuit block sufficiently busy. When input starvation is detected, top-level control circuit 104 may place the corresponding local control circuit 200 in a lower-power operating mode, causing the local control circuit 200 to lower operating parameters such as supply voltages, currents, etc., for corresponding asynchronous circuit blocks, because the asynchronous circuit blocks are (or will be) idling and wasting power (e.g., power lost via leakage). In some embodiments, the top-level control circuit 104 may also detect "under-performance" of asynchronous circuit blocks (e.g., where a local control circuit 200 is in a lower-power operating mode, so that a corresponding asynchronous circuit block's voltage is set to a low level and the asynchronous circuit block has become a bottleneck for operational performance) and, in response, cause the local control circuit 200 to operate in a higher-power operating mode, thereby causing the local control circuit 200 to increase the supply voltages to the effected asynchronous circuit blocks. Generally, in the described embodiments, top-level control circuit 104 continuously seeks a set of operating parameters for the asynchronous circuit blocks so that compute unit 102 is operating as efficiently and quickly as allowed by top-level control circuit 104 under corresponding thresholds (e.g., power and performance limits).

Operating Modes

As described herein, in some embodiments, top-level control circuit 104 sends control signals to local control circuit 200 to cause local control circuit 200 to transition to a corresponding operating mode or to remain in a current operating mode. In these embodiments, each operating mode is associated with corresponding operating parameters for one or more asynchronous circuits, so that local control circuit 200 sets the operating parameters for the asynchronous circuits in accordance with the operating mode. For example, in some embodiments, each operating mode is associated with fixed values for one or more operating parameters such as temperature, voltage, instruction execution rate, power consumption, etc. In these embodiments, upon receiving a signal from top-level control circuit 104 indicating the local control circuit 200 should enter an operating mode, local control circuit 200 sets the associated operating parameter(s) for corresponding asynchronous circuits to the fixed values. As another example, in some embodiments, each operating mode is associated with limits for operating parameters such as temperature, voltage, instruction execution rate, power use, etc. in one or more circuit blocks in compute unit 102. In these embodiments, local control circuit 200 may leave the operating parameter(s) for the corresponding asynchronous circuits unchanged until local control circuit 200 detects that the one or more circuit blocks have met the limit (e.g., exceeded, fallen below, averaged more than or less than, been more than or less than for a given amount of time, etc.), and then local control circuit 200 may dynamically adjust (and readjust) the operating parameter(s) for the corresponding asynchronous circuits.

In some embodiments, the operating modes include a higher-performance operating mode, which is an operating mode in which operating parameters such as temperature, voltage, instruction execution rate, power use, etc. are allowed, but not required, to be set to higher (relative to a lower-performance operating mode) and possibly maximum values. These embodiments may also include a lower-performance operating mode in which operating parameters such as temperature, voltage, instruction execution rate, power use, etc. should to be set to lower (relative to the higher-performance operating mode) and possibly minimum values. Some embodiments include a higher-power and lower-power operating mode, in which operating parameters such as power consumption, voltage, and current are allowed to be set to higher values and should be set to lower values, respectively. Generally, the described embodiments can support any number of operating modes, each associated with one or more operating parameters.

Software Control of Adjusting Operational Parameters

In some embodiments, software executed by computing device 100 (e.g., an operating system, firmware, an application, etc.) can cause top-level control circuit 104 and local control circuit 200 to adjust operational parameters as described above. In some of these embodiments, the software establishes/sets one or more thresholds (e.g., writes a value into performance limit register 112) and then causes top-level control circuit 104 to monitor the performance of the asynchronous circuit block 202-208 and/or other functional blocks in compute unit 102 to ensure that compute unit 102 is meeting the threshold.

In some embodiments, when causing top-level control circuit 104 to monitor the performance of one or more of asynchronous circuit blocks 204-208, the software issues "start" and "done" signals (or causes a circuit block to issue the signals) while the asynchronous circuit blocks perform operations. In these embodiments, the start signal causes top-level control circuit 104 to begin monitoring operating information (e.g., execution time, number of instructions executed, instruction execution rate, and/or other operating information) and the stop signal causes top-level control circuit 104 to stop monitoring the operating information. In some embodiments, the stop signal also causes top-level control circuit 104 to compare the monitored operating information to the thresholds set by the software.

In some embodiments, the software recognizes when certain sections of program code are to be executed in a higher-performance operating mode. For example, software may recognize a section program code that generates user-discernible effects (e.g., audio processing, video processing, etc.) is being executed. In these embodiments, the software can use the above-described mechanism to cause compute unit 102 to operate with sufficiently high performance (e.g., in a higher-performance operating mode) when executing the section of program code.

In some embodiments, a computing device (e.g., computing device 100 in FIG. 1 and/or some portion thereof) uses code and/or data stored on a computer-readable storage medium to perform some or all of the operations herein described. More specifically, the computing device reads the code and/or data from the computer-readable storage medium and executes the code and/or uses the data when performing the described operations.

A computer-readable storage medium can be any device or medium or combination thereof that stores code and/or data for use by a computing device. For example, the computer-readable storage medium can include, but is not limited to, volatile memory or non-volatile memory, including flash memory, random access memory (eDRAM, RAM, SRAM, DRAM, DDR, DDR2/DDR3/DDR4 SDRAM, etc.), read-only memory (ROM), and/or magnetic or optical storage mediums (e.g., disk drives, magnetic tape, CDs, DVDs). In the described embodiments, the computer-readable storage medium does not include transitory signals.

In some embodiments, one or more hardware modules are configured to perform the operations herein described. For example, the hardware modules can comprise, but are not limited to, one or more processors/cores/central processing units (CPUs), application-specific integrated circuit (ASIC) chips, field-programmable gate arrays (FPGAs), caches/cache controllers, memory controllers, compute units, embedded processors, graphics processors (GPUs)/graphics cores, pipelines, Accelerated Processing Units (APUs), and/ or other programmable-logic devices. When such hardware modules are activated, the hardware modules perform some or all of the operations. In some embodiments, the hardware modules include one or more general-purpose circuits that are configured by executing instructions (program code, firmware, etc.) to perform the operations.

In some embodiments, a data structure representative of some or all of the structures and mechanisms described herein (e.g., computing device 100 and/or some portion thereof) is stored on a computer-readable storage medium that includes a database or other data structure which can be read by a computing device and used, directly or indirectly, to fabricate hardware comprising the structures and mechanisms. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates/circuit elements from a synthesis library that represent the functionality of the hardware comprising the above-described structures and mechanisms. The netlist may then be placed and routed to produce a data set describing geometric shapes to be applied to masks. The masks may then be used in various semiconductor fabrication steps to produce a semiconductor circuit or circuits corresponding to the above-described structures and mechanisms. Alternatively, the database on the computer accessible storage medium may be the netlist (with or without the synthesis library) or the data set, as desired, or Graphic Data System (GDS) II data.

In this description, functional blocks may be referred to in describing some embodiments. Generally, functional blocks include one or more interrelated circuits that perform the described operations. In some embodiments, the circuits in a functional block include circuits that execute program code (e.g., microcode, firmware, applications, etc.) to perform the described operations.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. A method, comprising:
  in a top-level control circuit, performing operations for:
    acquiring operating information for one or more asynchronous circuits;
    acquiring additional operating information for one or more additional circuit blocks, the one or more additional circuit blocks separate from the one or more asynchronous circuits and interoperating with at least one of the one or more asynchronous circuits;
    comparing the operating information to one or more corresponding thresholds;
    determining that at least one operation is to be performed in at least one of the one or more asynchronous circuits based on the additional operating information acquired from the one or more additional circuit blocks; and
    based on the comparing and the determining, sending control signals to one or more local control circuits for the one or more asynchronous circuits, the control signals configured to cause the one or more local control circuits to make corresponding adjustments to one or more operational parameters for the one or more asynchronous circuits.

2. The method of claim 1, wherein the method further comprises:
  in the top-level control circuit, performing operations for a calibration, the operations comprising:
    causing the one or more asynchronous circuits to perform one or more operations while one or more operational parameters of the one or more asynchronous circuits are set to corresponding values;
    determining an operating estimate for each of the one or more operations, each operating estimate based on operating information acquired from the one or more asynchronous circuits while performing the one or more operations; and
    storing the operating estimates.

3. The method of claim 2,
  wherein acquiring the operating information for the one or more asynchronous circuits comprises acquiring an indication of one or more operations being and/or to be performed by the one or more asynchronous circuits; and
  wherein comparing the operating information to the one or more thresholds comprises:
    based on the stored operating estimates and the one or more operations being and/or to be performed, computing one or more values to be compared to corresponding thresholds; and
    comparing the computed one or more values to the corresponding thresholds.

4. The method of claim 1, wherein the operating information comprises one or more of values representing a power consumption and a performance of the one or more asynchronous circuits, and wherein comparing the operating information to one or more thresholds comprises:
  acquiring the one or more of the values representing power consumption and values representing performance from the operating information;
  acquiring corresponding threshold values; and
  comparing the one or more of the values representing power consumption and values representing performance to respective corresponding threshold values.

5. The method of claim 1, wherein sending control signals to the one or more local control circuits comprises, based on the comparing, sending to each local control circuit a control signal indicating one of:
  that the local control circuit may enter a higher-performance operating mode;
  that the local control circuit should enter a lower-performance operating mode; or
  that the local control circuit should remain in a current operating mode,
  wherein, based on an operating mode, each local control circuit makes corresponding adjustments to one or more operational parameters for asynchronous circuits that are controlled by the local control circuit.

6. The method of claim 1, wherein sending a control signal comprises:
  sending a signal to cause the corresponding local control circuit to adjust an output voltage of a voltage regulator that supplies a voltage to one or more asynchronous circuits that are controlled by the local control circuit.

7. The method of claim 6, wherein the output voltage is supplied to a first portion of the corresponding asynchronous circuit and an additional output voltage is supplied to separate second portion of the corresponding asynchronous circuit, and wherein causing the local control circuit to adjust the output voltage of the voltage regulator comprises:

causing the local control circuit to leave the additional operating voltage unchanged, so that the voltage supplied to the second portion of the asynchronous circuit remains at a specified voltage.

8. The method of claim 1, wherein the control circuit is further coupled to a synchronous circuit, and wherein the method further comprises:

based on the comparing, sending an additional control signal to the local control circuit, the additional signal configured to cause the local control circuit to make a corresponding adjustment to one or more operational parameters for the synchronous circuit.

9. A computing device, comprising:

one or more asynchronous circuits;

a top-level control circuit; and one or more local control circuits, each local control circuit controlling one or more operating parameters for at least one corresponding asynchronous circuit;

wherein the top-level control circuit performs operations for:

acquiring operating information for one or more of the asynchronous circuits;

acquiring additional operating information for one or more additional circuit blocks, the one or more additional circuit blocks separate from the one or more asynchronous circuits and interoperating with at least one of the one or more asynchronous circuits;

comparing the operating information to one or more corresponding thresholds;

determining that at least one operation is to be performed in at least one of the one or more asynchronous circuits based on the additional operating information acquired from the one or more additional circuit blocks; and based on the comparing and the determining, sending control signals to one or more of the local control circuits;

wherein each of the one or more of the local control circuits to which the top-level control circuit sends a control signal performs operations for:

based on the control signal, making corresponding adjustments to one or more operational parameters for the at least one corresponding asynchronous circuit.

10. The computing device of claim 9, wherein the top-level control circuit performs operations for a calibration, the operations comprising:

causing the one or more of the asynchronous circuits to perform one or more operations while one or more operational parameters of the one or more of the asynchronous circuits are set to corresponding values;

determining an operating estimate for each of the one or more operations, each operating estimate based on operating information acquired from the one or more of the asynchronous circuits while performing the one or more operations; and storing the operating estimates.

11. The computing device of claim 10, wherein acquiring the operating information for the one or more of the asynchronous circuits comprises acquiring an indication of one or more operations being and/or to be performed by the one or more of the asynchronous circuits; and wherein comparing the operating information to the one or more thresholds comprises:

based on the stored operating estimates and the one or more operations being and/or to be performed, computing one or more values to be compared to corresponding thresholds; and comparing the computed one or more values to the corresponding thresholds.

12. The computing device of claim 9, wherein the operating information comprises one or more of values representing a power consumption and a performance of the one or more of the asynchronous circuits, and wherein comparing the operating information to one or more thresholds comprises:

acquiring the one or more of the values representing power consumption and values representing performance from the operating information;

acquiring corresponding threshold values; and comparing the one or more of the values representing power consumption and values representing performance to respective corresponding threshold values.

13. The computing device of claim 9, wherein sending control signals to the one or more of the local control circuits comprises, based on the comparing, sending to each local control circuit a control signal indicating one of:

that the local control circuit may enter a higher-performance operating mode;

that the local control circuit should enter a lower-performance operating mode; or that the local control circuit should remain in a current operating mode, wherein, based on an operating mode, each local control circuit makes corresponding adjustments to one or more operational parameters for asynchronous circuits that are controlled by the local control circuit.

14. The computing device of claim 9, wherein sending a control signal comprises:

sending a signal to cause the corresponding local control circuit to adjust an output voltage of a voltage regulator that supplies a voltage to one or more asynchronous circuits that are controlled by the local control circuit.

15. The computing device of claim 9, further comprising:

a synchronous circuit;

wherein the top-level control circuit performs operations for:

based on the comparing, sending an additional control signal to the local control circuit, the additional signal configured to cause the local control circuit to make a corresponding adjustment to one or more operational parameters for the synchronous circuit.

16. A non-transitory computer-readable storage medium storing instructions that, when executed by a top-level controller in a computing device, cause the top-level controller to perform operations for:

acquiring operating information for one or more asynchronous circuits;

acquiring additional operating information for one or more additional circuit blocks, the one or more additional circuit blocks separate from the one or more asynchronous circuits and interoperating with at least one of the one or more asynchronous circuits;

comparing the operating information to one or more corresponding thresholds;

determining that at least one operation is to be performed in at least one of the one or more asynchronous circuits based on the additional operating information acquired from the one or more additional circuit blocks; and based on the comparing and the determining, sending control signals to one or more local control circuits for the one or more asynchronous circuits, the control signals configured to cause the one or more local control circuits to make corresponding adjustments to one or more operational parameters for the one or more asynchronous circuits.

17. The computer-readable storage medium of claim 16, wherein the top-level control circuit further performs operations for a calibration, the operations comprising:
   causing the one or more asynchronous circuits to perform one or more operations while one or more operational parameters of the one or more asynchronous circuits are set to corresponding values;
   determining an operating estimate for each of the one or more operations, each operating estimate based on operating information acquired from the one or more asynchronous circuits while performing the one or more operations; and
   storing the operating estimates.

18. The computer-readable storage medium of claim 17,
   wherein acquiring the operating information for the one or more asynchronous circuits comprises acquiring an indication of one or more operations being and/or to be performed by the one or more asynchronous circuits; and
   wherein comparing the operating information to the one or more thresholds comprises:
      based on the stored operating estimates and the one or more operations being and/or to be performed, computing one or more values to be compared to corresponding thresholds; and
      comparing the computed one or more values to the corresponding thresholds.

* * * * *